US012603480B2

(12) United States Patent
Jiang et al.

(10) Patent No.: US 12,603,480 B2
(45) Date of Patent: Apr. 14, 2026

(54) SEMICONDUCTOR LASER WITH METAL PULL-BACK DBR GRATING

(71) Applicant: MACOM Technology Solutions Holdings, Inc., Lowell, MA (US)

(72) Inventors: Yifan Jiang, Pinellas Park, FL (US); Wolfgang Parz, Ithaca, NY (US); Padman Parayanthal, Clinton Township, NJ (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 649 days.

(21) Appl. No.: 17/990,734

(22) Filed: Nov. 20, 2022

(65) Prior Publication Data

US 2024/0170920 A1 May 23, 2024

(51) Int. Cl.
| | |
|---|---|
| *H01S 3/08* | (2023.01) |
| *H01S 5/042* | (2006.01) |
| *H01S 5/0625* | (2006.01) |
| *H01S 5/12* | (2021.01) |
| *H01S 5/125* | (2006.01) |
| *H01S 5/22* | (2006.01) |
| *H01S 5/343* | (2006.01) |

(52) U.S. Cl.
CPC ............ *H01S 5/22* (2013.01); *H01S 5/04256* (2019.08); *H01S 5/06256* (2013.01); *H01S 5/12* (2013.01); *H01S 5/1215* (2013.01); *H01S 5/125* (2013.01); *H01S 5/3434* (2013.01)

(58) Field of Classification Search
CPC .... H01S 5/22; H01S 5/04256; H01S 5/06256; H01S 5/12; H01S 5/1215; H01S 5/125; H01S 5/3434
See application file for complete search history.

(56) References Cited

U.S. PATENT DOCUMENTS

| | | | | |
|---|---|---|---|---|
| 4,464,762 A | * | 8/1984 | Furuya | H01S 5/125 385/131 |
| 4,573,158 A | * | 2/1986 | Utaka | H01S 5/12 372/50.1 |
| 5,031,188 A | * | 7/1991 | Koch | H01S 5/125 372/96 |
| 2004/0141540 A1 | * | 7/2004 | Masood | H01S 5/125 372/97 |
| 2006/0120421 A1 | * | 6/2006 | Matsuda | H01S 5/12 372/43.01 |

(Continued)

FOREIGN PATENT DOCUMENTS

| | | |
|---|---|---|
| JP | 5-48214 A | 2/1993 |
| WO | WO2017155901 A1 | 9/2017 |

OTHER PUBLICATIONS

International Search Report and Written Opinion of the International Searching Aurhority; Dec. 20, 2023.

*Primary Examiner* — Kinam Park

(74) *Attorney, Agent, or Firm* — Jeffery J. Brosemer

(57) ABSTRACT

Aspects of the present disclosure describe semiconductor DFB laser structures including both pumped and unpumped regions/sections wherein unpumped regions act as DBR reflector(s) while pumped regions act as DFB gratings. Semiconductor DFB laser devices according to aspects of the present disclosure include an active layer that extends the length of the device that is identical in both pumped and unpumped regions/sections.

20 Claims, 9 Drawing Sheets

$Pitch_{G1} \approx Pitch_{G2} \approx Pitch_{G4} \neq Pitch_{G3}$

(56) References Cited

U.S. PATENT DOCUMENTS

| | | | |
|---|---|---|---|
| 2015/0071589 A1* | 3/2015 | Nakamura | H01S 5/124 |
| | | | 385/37 |
| 2015/0288140 A1* | 10/2015 | Davies | H01S 5/1064 |
| | | | 372/33 |
| 2017/0256912 A1* | 9/2017 | Matsui | H01S 5/141 |
| 2019/0165544 A1* | 5/2019 | Suzuki | H01S 5/124 |
| 2020/0018701 A1* | 1/2020 | Meyer | G01J 3/0259 |
| 2024/0047939 A1* | 2/2024 | Matsui | H01S 5/028 |

* cited by examiner $$Pitch_{G1} = Pitch_{G2} = Pitch_{G4} \neq Pitch_{G3}$$

$$Pitch_{G1} = Pitch_{G2} = Pitch_{G4} \neq Pitch_{G3}$$

SEMICONDUCTOR LASER WITH METAL PULL-BACK DBR GRATING

TECHNICAL FIELD

This disclosure relates generally to semiconductor lasers, and more particularly to a metal pull-back/opening pull-back grating that advantageously improves the slope efficiency of a Distributed Feedback laser (DFB) or improves modulation bandwidth of a directly modulated laser.

BACKGROUND

A DFB semiconductor laser is a laser in which a Bragg grating structure is arranged (i.e., distributed) along a waveguide portion (i.e., the portion of the laser in which electromagnetic radiation propagates) to interact with propagating radiation to suppress multiple longitudinal modes and enhance a single longitudinal mode. Thus, the longitudinal grating interacts with electromagnetic radiation along the waveguide, rather than just at the ends as in the case with Fabry-Perot (F-P) type lasers, in which reflectors are arranged at opposite ends of a cavity. DFB semiconductor lasers are used as a light source in a wide variety of contemporary applications including—but not limited to— optical communications systems including cable television (CATV), pumping light sources for small solid-state lasers or second harmonic generation (SHG) short wavelength lasers for high-density information recording, and optical measurement systems.

Given their importance, improved DFB laser devices would be a welcome addition to the art.

SUMMARY

An advance in the art is made according to aspects of the present disclosure directed to DFB semiconductor laser structures that advantageously exhibit improved slope efficiency.

In sharp contrast to the prior art, DFB semiconductor lasers according to aspects of the present disclosure employ a metal pull-back/opening pull-back grating and include both pumped and unpumped regions/sections wherein unpumped regions act as DBR reflector(s) while pumped regions act as DFB gratings.

In further contrast to the prior art, semiconductor DFB laser devices according to aspects of the present disclosure include a quantum well active layer that extends the length of the device that is identical in both pumped and unpumped regions/sections—greatly simplifying their construction.

BRIEF DESCRIPTION OF THE DRAWING

A more complete understanding of the present disclosure may be realized by reference to the accompanying drawing in which.

DESCRIPTION

Figure 1:
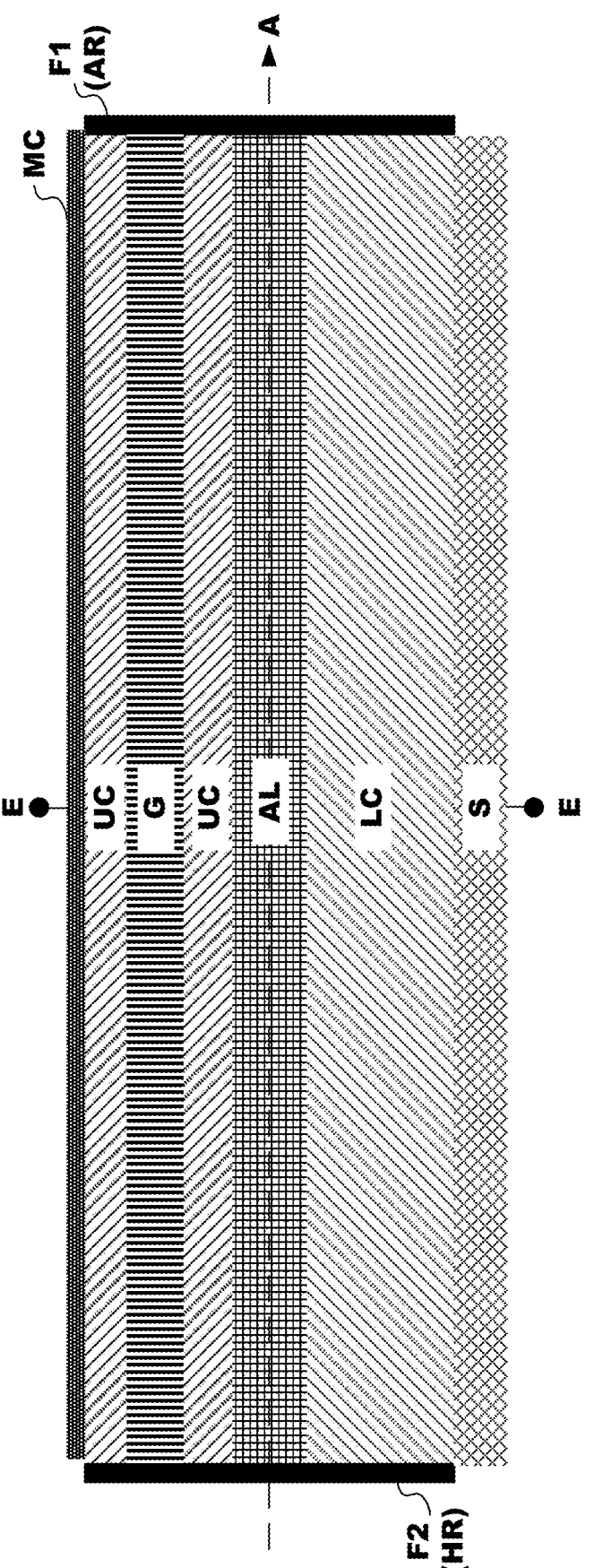
FIG. 1 is a schematic diagram illustrating a semiconductor DFB laser as is known in the art.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGs comprising the drawing are not drawn to scale.

By way of some additional background, we now describe FIG. 1—a schematic diagram illustrating a semiconductor DFB laser as is known in the art.

As shown in that figure, the semiconductor DFB laser includes a multiple-layer semiconductor waveguide structure, extending along a longitudinal axis A, that structure comprising lower cladding layer LC of semiconductor material, an active layer AL (which may also be referred to as an active region) of semiconductor material, and an upper cladding layer UC of semiconductor material formed over the active layer.

The active layer AL material has a higher refractive index than the adjacent cladding layers, resulting in better confinement of electromagnetic radiation in the active layer. The active layer thus acts as a dielectric waveguide.

Although not shown in the figure, it is known for the lower cladding, upper cladding, and active layers themselves to have a multi-layer structure.

A Bragg grating G is shown in highly schematic form, superimposed on the upper cladding layer UC. The Bragg grating G is arranged to provide a periodic variation in effective refractive index along the waveguide.

Light propagating along the waveguide interacts with the Bragg grating G periodic structure such that a single longitudinal mode is enhanced (that mode having a wavelength corresponding to the Bragg wavelength of the grating G) and other modes are suppressed.

The Bragg grating G may take a variety of forms. For example, it may be provided by a corrugated interface between two semiconductor layers with different refractive indices or may comprise a spatially periodic refractive index variation written into a single layer.

Laterally coupled DFB lasers are also known, where the grating G comprises longitudinal series of elements, arranged on either side of a longitudinal laser ridge in the upper cladding layer, where each element extends transversely with respect to the longitudinal axis, from the ridge. Other forms of Bragg grating structures, to provide distributed feedback, will be apparent to those skilled in the art, and may be also used in various embodiments of the invention.

Returning to the device of FIG. 1, facets F1 and F2 are formed at opposite ends of the structure, the first facet F1 being provided with an anti-reflection coating AR, and the second facet F2 being provided with a high-reflection coating HR. When electrical power is supplied to energize the laser via electrodes E, a light beam is emitted from the active layer at the anti-reflection coating end, F1.

In typical known semiconductor DFB devices, the facets may be formed by cleaving the multi-layer semiconductor structure, in or on which the Bragg grating has already been formed.

Figure 2:
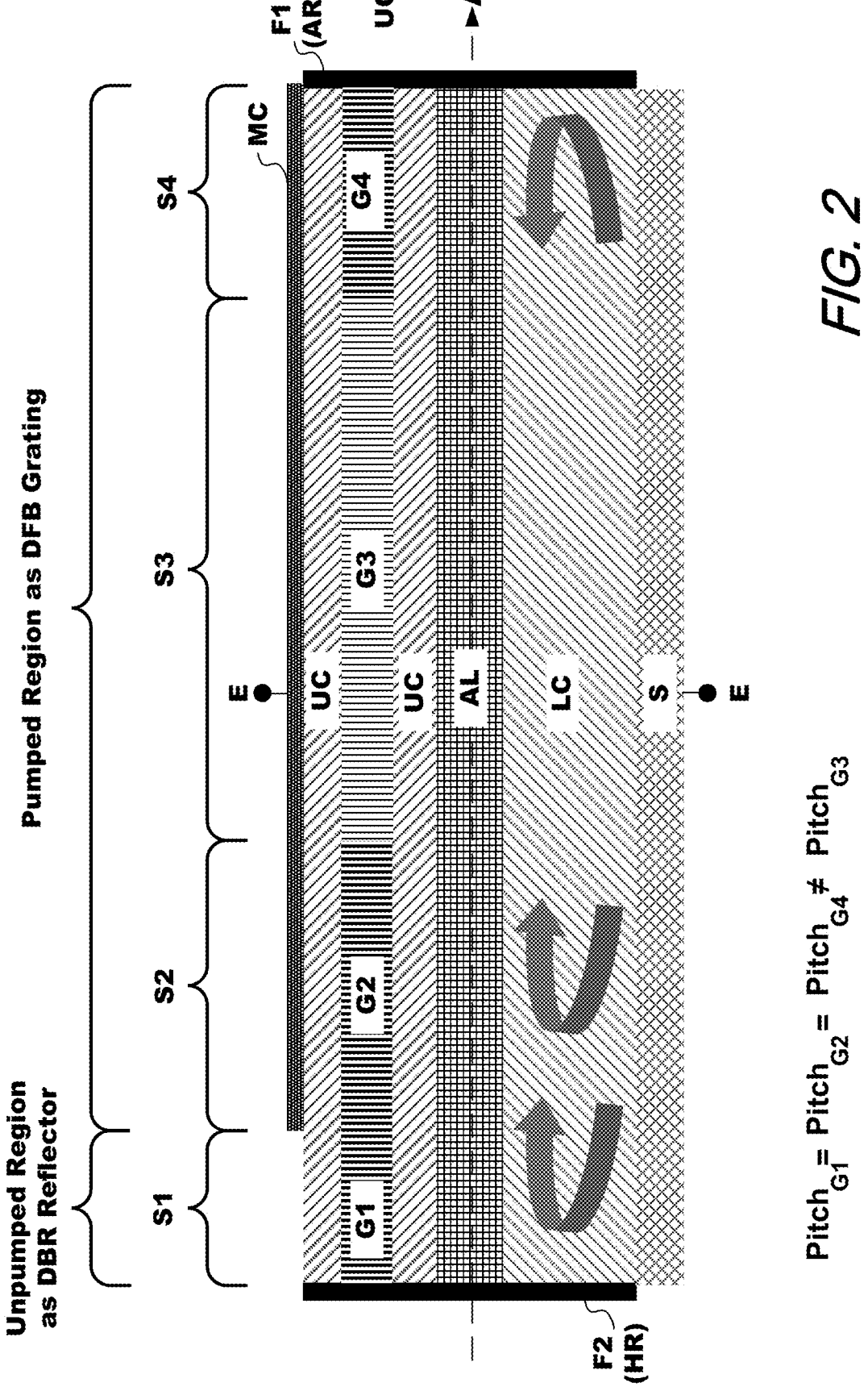
FIG. 2 is a schematic diagram illustrating a semiconductor DFB laser including a Distributed Bragg Reflector (DBR) reflector positioned in an unpumped region according to aspects of the present disclosure.

FIG. 2 is a schematic diagram illustrating a semiconductor DFB laser including a Distributed Bragg Reflector (DBF) reflector according to aspects of the present disclosure.

As shown in FIG. 2, the laser includes a multiple-layer semiconductor waveguide structure, extending along a longitudinal axis, that structure comprising lower cladding layer LC of semiconductor material, an active region layer AL of semiconductor material, and an upper cladding layer UC of semiconductor material formed over the active region layer AL. While not specifically shown, the structure of FIG. 2 may include one or more other layers including a compound semiconductor material of a substrate.

Facets FF (Front Facet) and BF (Back Facet) are formed at opposite ends of the structure, the front facet FF being provided with an anti-reflection coating AR, and the back facet BF may be angled such that it exhibits a reflection characteristic of <~5%.

As illustrated in this figure, the overall laser structure is shown having several sections S1, S2, S3, and S4. Each of the individual sections is shown to include a respective Bragg grating G1, G2, G3, and G4, which are shown in highly schematic form, superimposed on/in the upper cladding layer UC. The Bragg gratings G1, G2, G3, and G4 are configured and arranged to provide a periodic variation in effective refractive index along the waveguide. Note that as illustratively shown, not all the individual sections including individual gratings are configured identically. More particularly, Bragg gratings in different sections may exhibit different grating pitches/characteristics.

A metal contact MC is shown overlying several sections (S2, S3, and S4) of the upper cladding UC, but not overlying section S1 ("metal pull-back"). Consequently, when electrical power is supplied to the laser via electrodes E, sections S2, S3, and S4 form an overall pump region of the laser while section S1—is unpumped—and acts as a DBR reflector. Such pumping results in a light beam emitted from the active layer at the antireflection coating end.

Accordingly, when so configured and energized, the gratings included in sections S2, S3, and S4 namely, G2, G3, and G4 act as DFB grating(s) and provide a periodic variation in effective refractive index along the waveguide. Conversely, section S1 is not pumped in this illustrative configuration, and grating G1 acts as a passive DBR reflector.

The active region layer AL may be a quantum well active layer comprising InAlGaAs (or other material) quantum well structures overlying the lower cladding LC which may exhibit a specific doping. When so configured, the upper cladding UC may exhibit a specific, opposite/complementary doping (i.e., n-type, p-type). For example, the lower cladding may be n-type doped while the upper cladding may be p-type doped—or vice-versa and may include InGaAsP or other known suitable materials. Such p-type doped, and n-type doped cladding layers may both comprise the same compound semiconductor material as a substrate (not specifically shown).

As noted previously, the individual gratings disposed in the various sections of the device may—or may not—exhibit similar or dissimilar grating characteristics. Shown illustratively in FIG. 2, grating G1—located in section S1, the DBR reflector section—exhibits a same grating pitch as G2 and G4, shown located in sections S2 and S4, respectively.

Grating G3, shown as located in pumped section S3, exhibits a slightly different grating pitch from the other three gratings, G1, G2, and G4. As such, section S3 is configured as a phase shift section for the DFB grating.

We note further with respect to grating and grating strength that the grating strength should be high enough such that the DBR reflector (shown as grating G1 in section S1 in FIG. 2) is in the range of 200 $cm^{-1}$-300 $cm^{-1}$.

According to aspects of the present disclosure, the active layer AL—for example—InAlGaAs quantum wells—is substantially identical throughout the AL. Consequently, the active layer material shown underlying S1, G1; S2, G2; S3, G3; and S4, G4, is substantially identical.

As those skilled in the art will readily understand and appreciate, such identicality of active layer AL throughout the entire layer length—regardless of pump, grating pitch, and axial location, greatly simplifies the manufacture of devices according to the present disclosure that include both DFB and DBR grating(s) on the same device.

In an illustrative embodiment according to aspects of the present disclosure, the total length (L—not specifically shown in the figures) of such illustrative device as defined by the distance between the two facets, wherein the device has both its grating(s) and active layer extending the full distance. Note further that in an illustrative embodiment, L<150 µm. The length of the unpumped, DBR reflector region (section) is <100 µm for such device and preferably on the order of half the cumulative length of the pumped region(s) (sections). As such the unpumped length is <½ pumped length.

The combined lengths of gratings G1, G2, G3, and G4 are illustratively shown extending over the entire L of the DFB laser device so that the distance from respective inner edges of the adjacent facets to gratings G1 and G4 is zero.

Finally, we note that while not specifically shown in the schematic figures, the DFB laser device may include waveguide structure formed of a compound semiconductor layer that extends the length of the device, such layer being compositionally different from the compound semiconductor material of a substrate. Such waveguide structure and other layers of disclosed devices can be created by known epitaxial growth (e.g., Molecular Beam Epitaxy (MBE)) utilizing modified layer compositions such that wave-guiding portions of cladding layer being a high index layers being higher than adjacent layers such as InGaAsP vs InP. Such refractive index differences and any layer thicknesses can be selected in order to create a structure supporting a desired fundamental mode.

Figure 3:
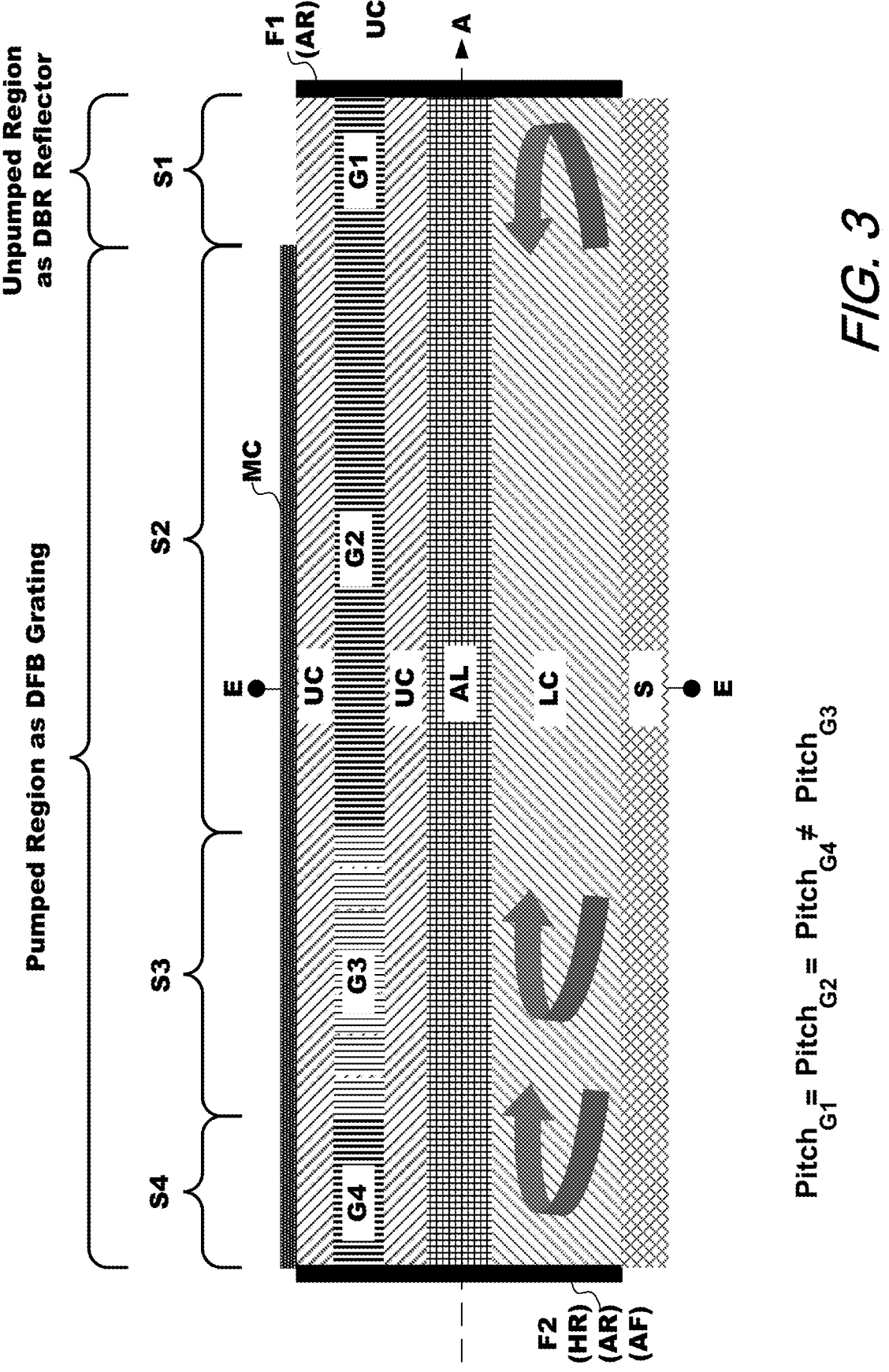
FIG. 3 is a schematic diagram illustrating another semiconductor DFB laser including a Distributed Bragg Reflector (DBR) reflector positioned in an unpumped region different from that illustrated in FIG. 2, according to aspects of the present disclosure.

FIG. 3 is a schematic diagram illustrating another semiconductor DFB laser including a Distributed Bragg Reflector (DBR) reflector positioned in an unpumped region different from that illustrated in FIG. 2, according to aspects of the present disclosure.

As illustrated in FIG. 3, the structure shown therein is quite like that shown in FIG. 2, except for the location of the unpumped region and the phase shift section. As illustrated, the unpumped region that acts as DBR reflector is now within section S1, with grating G1, while the pumped section S3 grating, G3, exhibits a different pitch from the other gratings (G1, G2, and G4) and therefore provides a phase shift section. Finally, gratings G1, G2, and G4 may exhibit the same grating pitch as one another.

As further shown illustratively in FIG. 3, the back facet BF, can be a high reflection (HR) coated facet, an anti-reflection (AR) coated facet, or an angled facet that provides a desired level of reflection.

Figure 4:
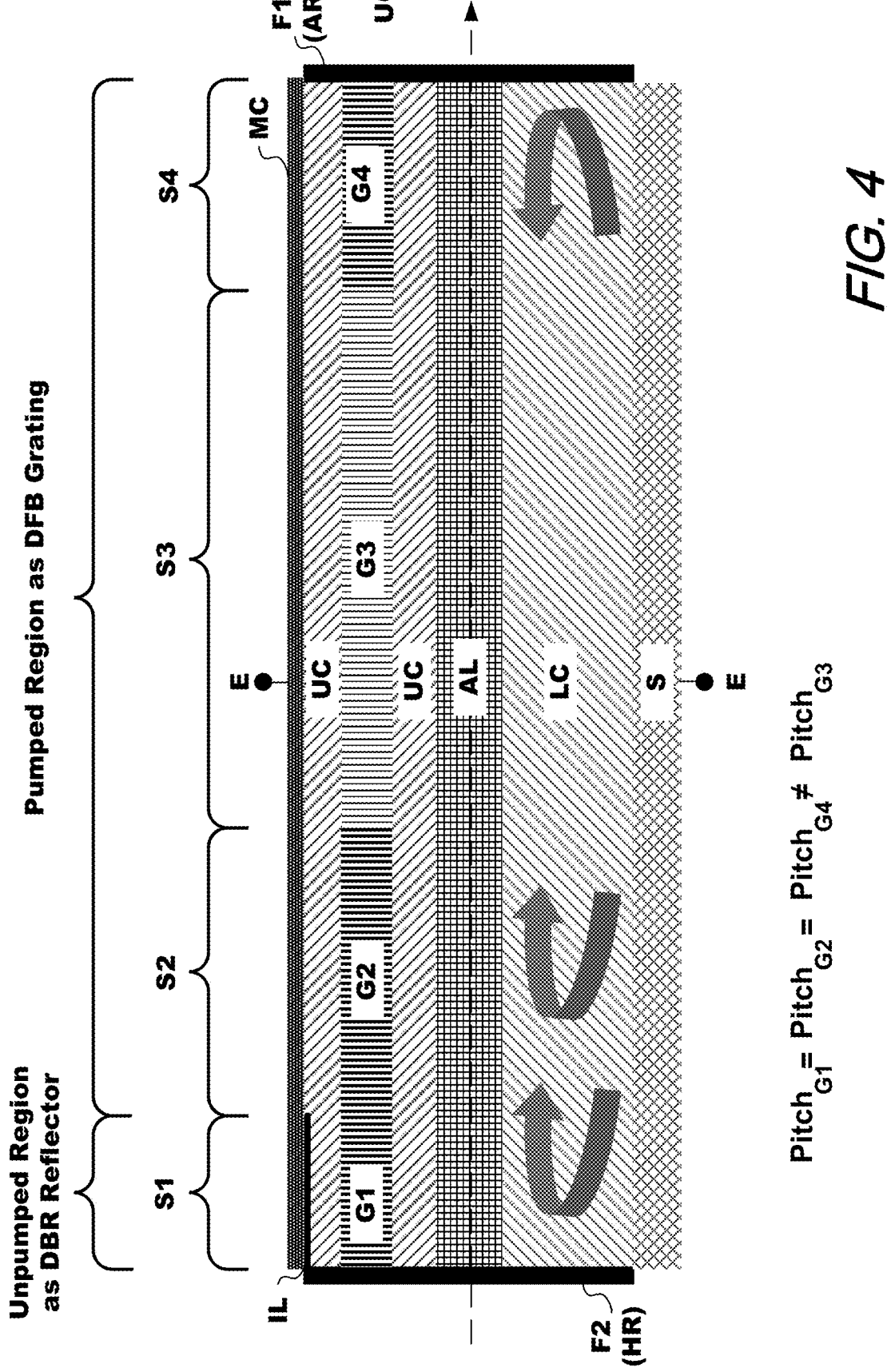
FIG. 4 is a schematic diagram illustrating another semiconductor DFB laser including a Distributed Bragg Reflector (DBR) reflector wherein the metal contact overlies the entire structure, and pumping is disabled in a section via electrical isolation layer according to aspects of the present disclosure.

FIG. 4 is a schematic diagram illustrating another semiconductor DFB laser including a Distributed Bragg Reflector (DBR) reflector wherein the metal contact overlies the entire structure, and pumping is disabled in a section via electrical isolation layer according to aspects of the present disclosure.

As illustrated in the figure, a metal contact (MC) layer is shown disposed over an entire top surface of the DFB laser device illustrated. According to an aspect of the present disclosure wherein DFB laser devices will include both pumped and unpumped sections/regions, such unpumped section is achieved by underlying the metal contact in that unpumped section by an insulating layer IL, such as one formed from silicon dioxide or other suitable electrical insulating material.

Figure 5:
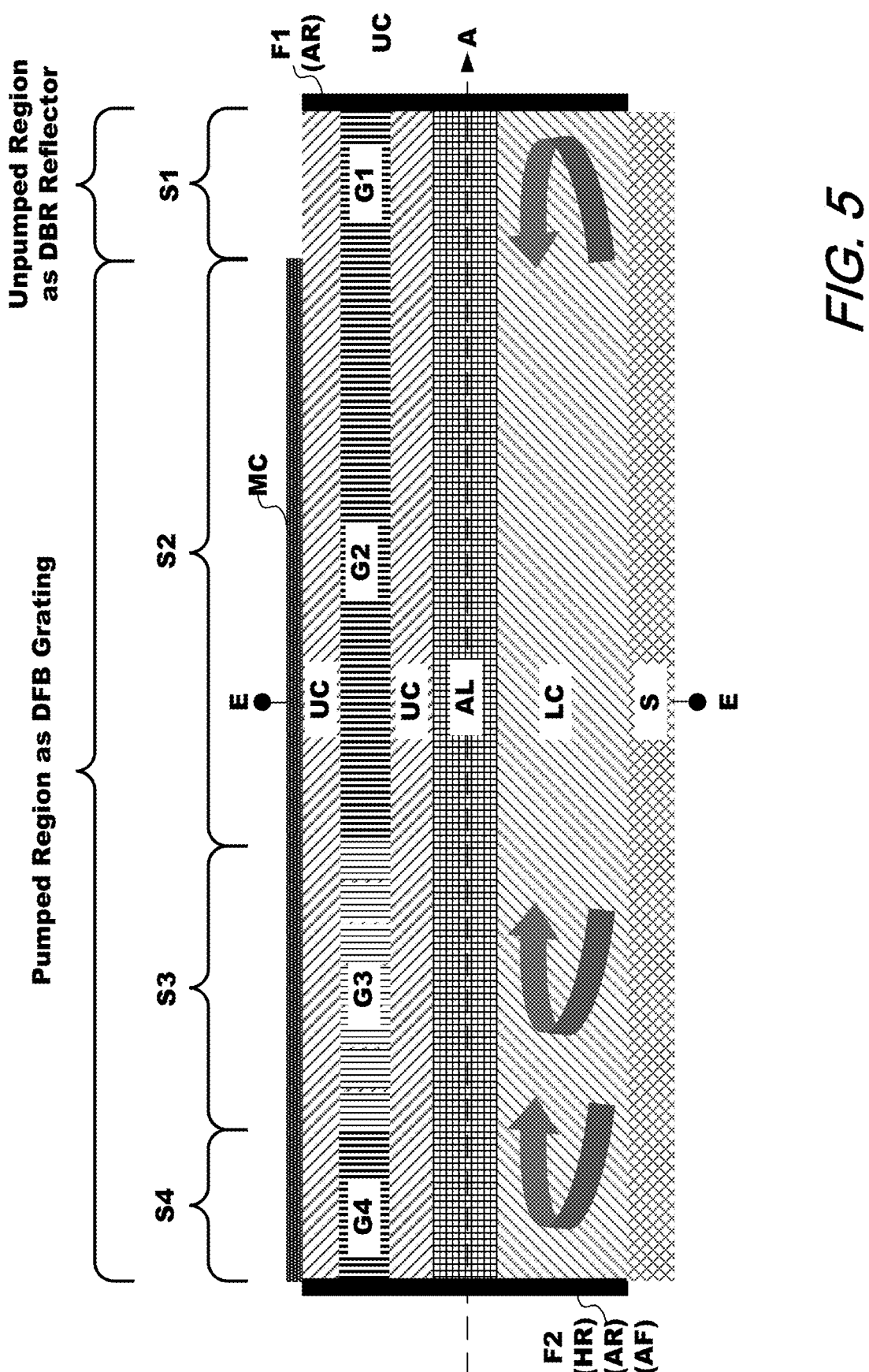
FIG. 5 is a schematic diagram illustrating yet another semiconductor DFB laser including a Distributed Bragg Reflector (DBR) reflector wherein the DBR is formed in an unpumped region and provides an increased modulation bandwidth and reduced chirp factor according to aspects of the present disclosure.

FIG. 5 is a schematic diagram illustrating yet another semiconductor DFB laser including a Distributed Bragg Reflector (DBR) reflector wherein the DBR is formed in an unpumped region and provides an increased modulation bandwidth and reduced chirp factor according to aspects of the present disclosure.

As illustratively shown in that figure, three sections S2, S3, and S4 are configured as pumped regions while section S1 is unpumped. As a result, the pumped regions act as a DFB grating while the unpumped region acts as DBR reflector. As was the case with previous embodiments, section S3 is configured as a phase shift section for the DFB grating and exhibits a grating G3 having a grating pitch that is not equal to the others. Conversely, gratings configured in section S2 and section S4 namely, G2 and G4, are illustrated as having the same pitch as one another. The grating configured in section S1, namely G1, likewise exhibits a unique grating pitch from the others. Note that as illustrated, unpumped section S1 does not include a metal pull back or opening pull-back region defined by the absence of an overlying metal. Note however, that as previously shown such section may exhibit an effective pull back if an underlying insulator such as Silicon Dioxide is included in this section and an overlying metal layer is present.

We note that by changing the grating pitch of the grating in this this section S1 namely, grating G1, a detuned loading effect is induced resulting in an increased bandwidth and simultaneously reduced chirp factor.

In a preferred embodiment, the grating pitch for this section S1 should be smaller than section S2 by 0.1 to 1.5 nm, depending on the ridge width of the section.

Figure 6:
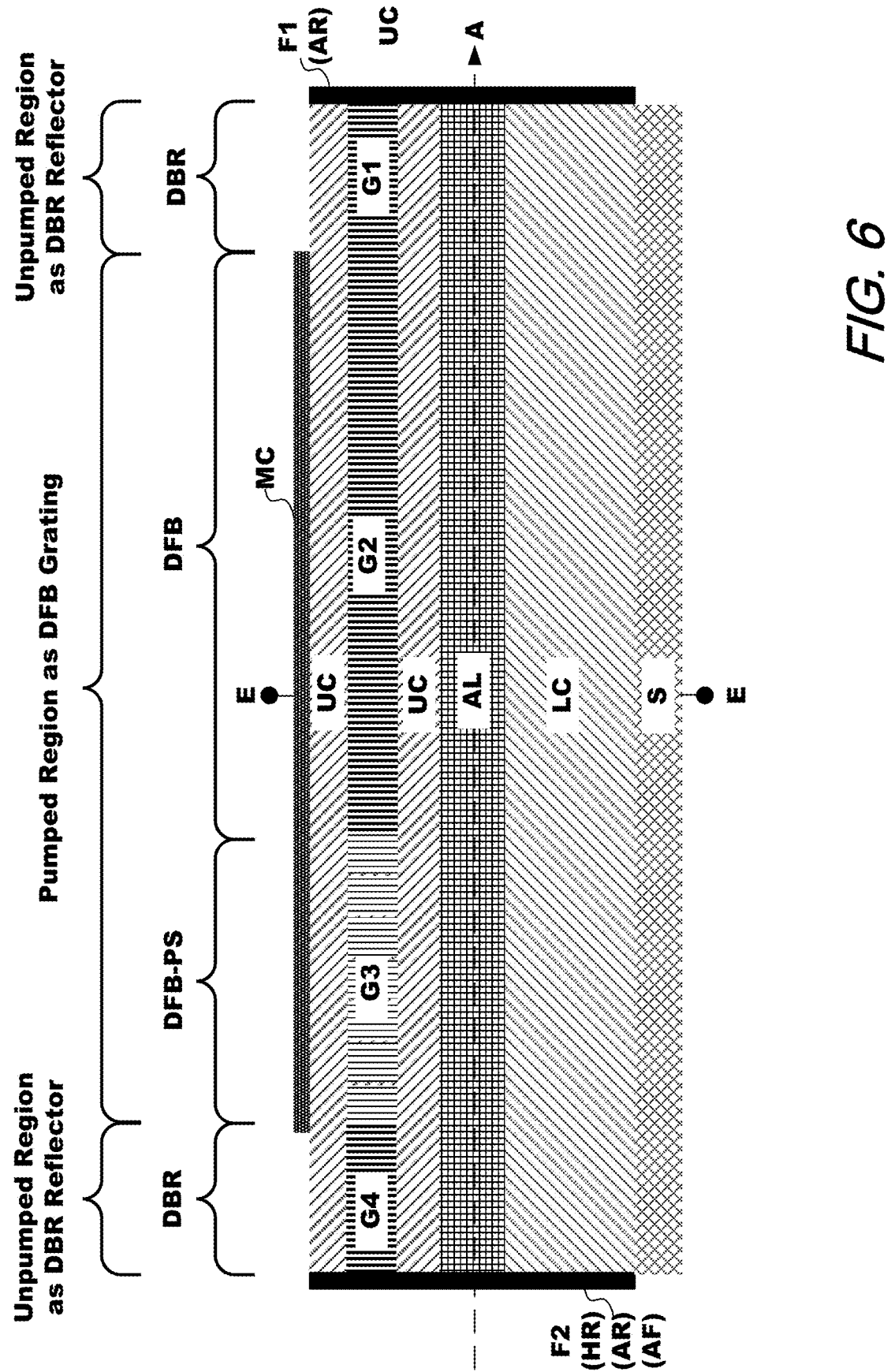
FIG. 6 is a schematic diagram illustrating yet another semiconductor DFB laser including a Distributed Bragg Reflector (DBR) reflector wherein multiple DBR section are formed at both ends of the device according to aspects of the present disclosure.

FIG. 6 is a schematic diagram illustrating yet another semiconductor DFB laser including a Distributed Bragg Reflector (DBR) reflector wherein multiple DBR section are formed at both ends of the device according to aspects of the present disclosure.

As illustratively shown in this figure, there is formed an unpumped DBR section at both ends of the device and a pumped region as DFB grating formed between the two DBR sections. As shown, the central pumped region includes a phase shift section DFB-PS and two DFB sections DFB at each end of the phase shift region. Note that specific grating pitch for each of the sections is/are configurable as application needs dictate.

Figure 7:
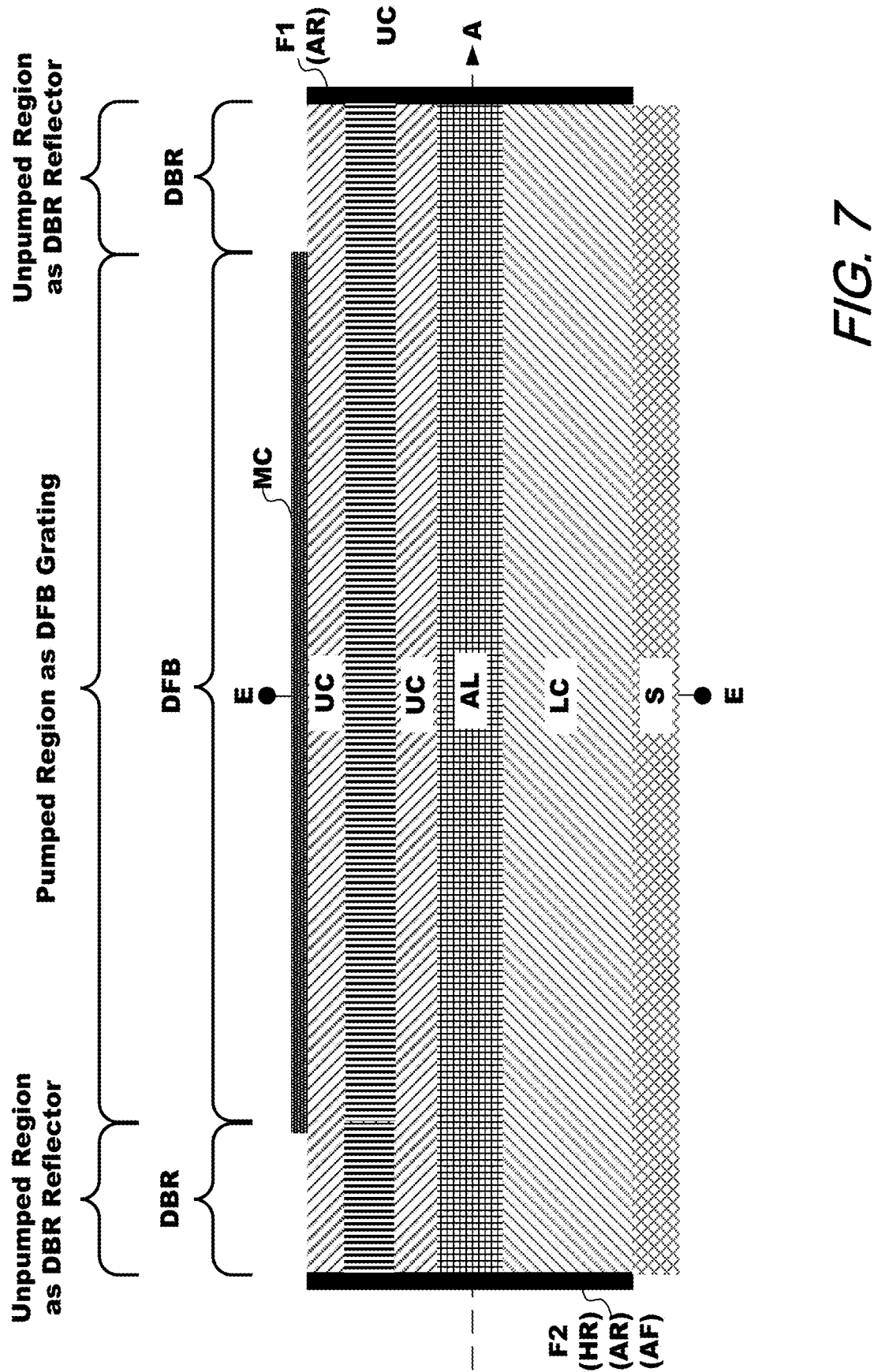
FIG. 7 is a schematic diagram illustrating yet another semiconductor DFB laser including a Distributed Bragg Reflector (DBR) reflector wherein multiple DBR section are formed at both ends of the device and a uniform DFB section is interposed between according to aspects of the present disclosure.

FIG. 7 is a schematic diagram illustrating yet another semiconductor DFB laser including a Distributed Bragg Reflector (DBR) reflector wherein multiple DBR section are formed at both ends of the device according to aspects of the present disclosure.

As shown in this figure, a central pumped region DFB includes a uniform grating along the entire length of the pumped region.

Figure 8:
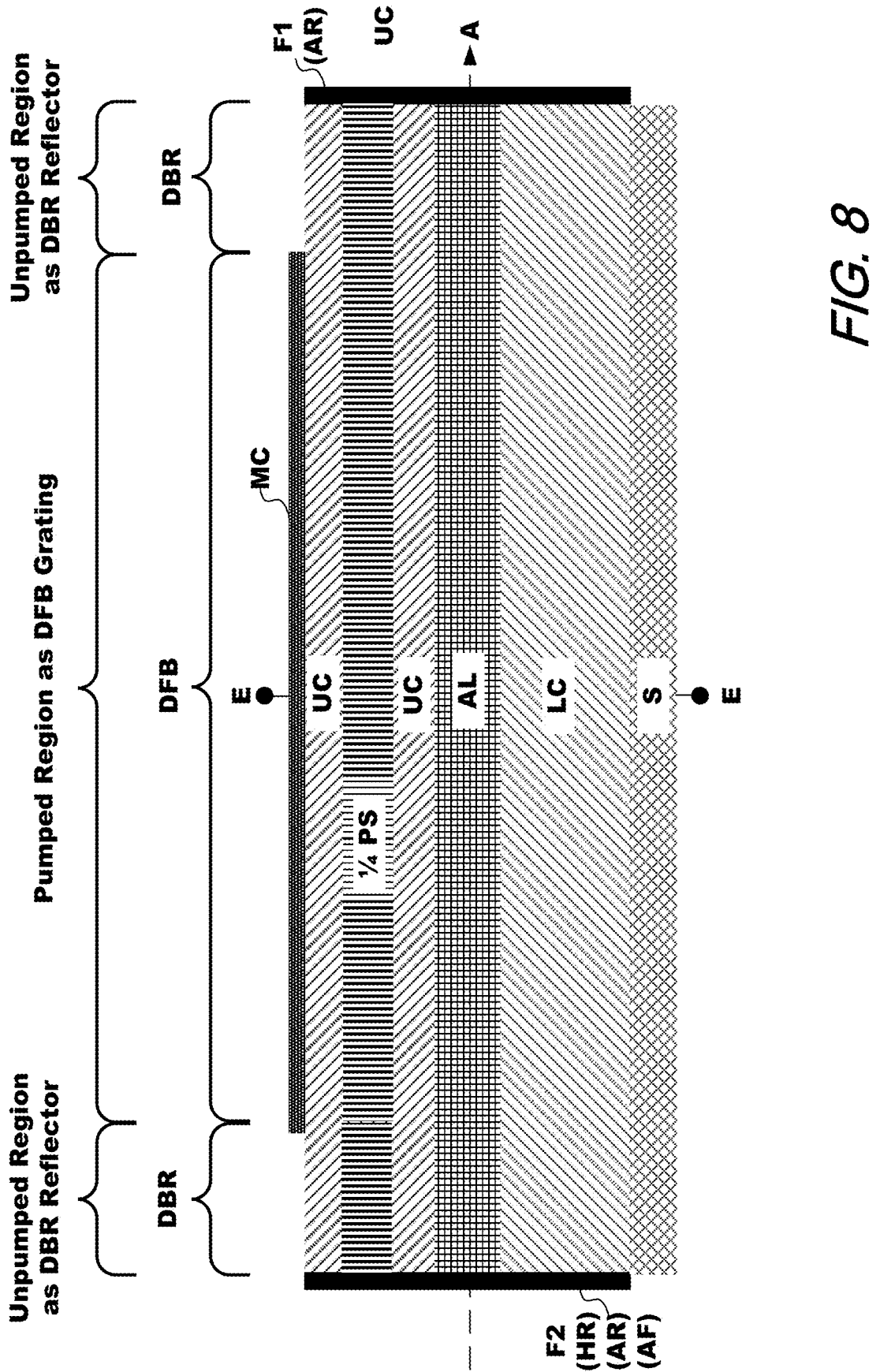
FIG. 8 is a schematic diagram illustrating yet another semiconductor DFB laser including a Distributed Bragg Reflector (DBR) reflector wherein multiple DBR section are formed at both ends of the device and a DFB section including ¼ wave phase shifter is interposed according to aspects of the present disclosure.

FIG. 8 is a schematic diagram illustrating yet another semiconductor DFB laser including a Distributed Bragg Reflector (DBR) reflector wherein multiple DBR section are formed at both ends of the device and a DFB section including ¼ wave phase shifter is interposed according to aspects of the present disclosure.

Figure 9:
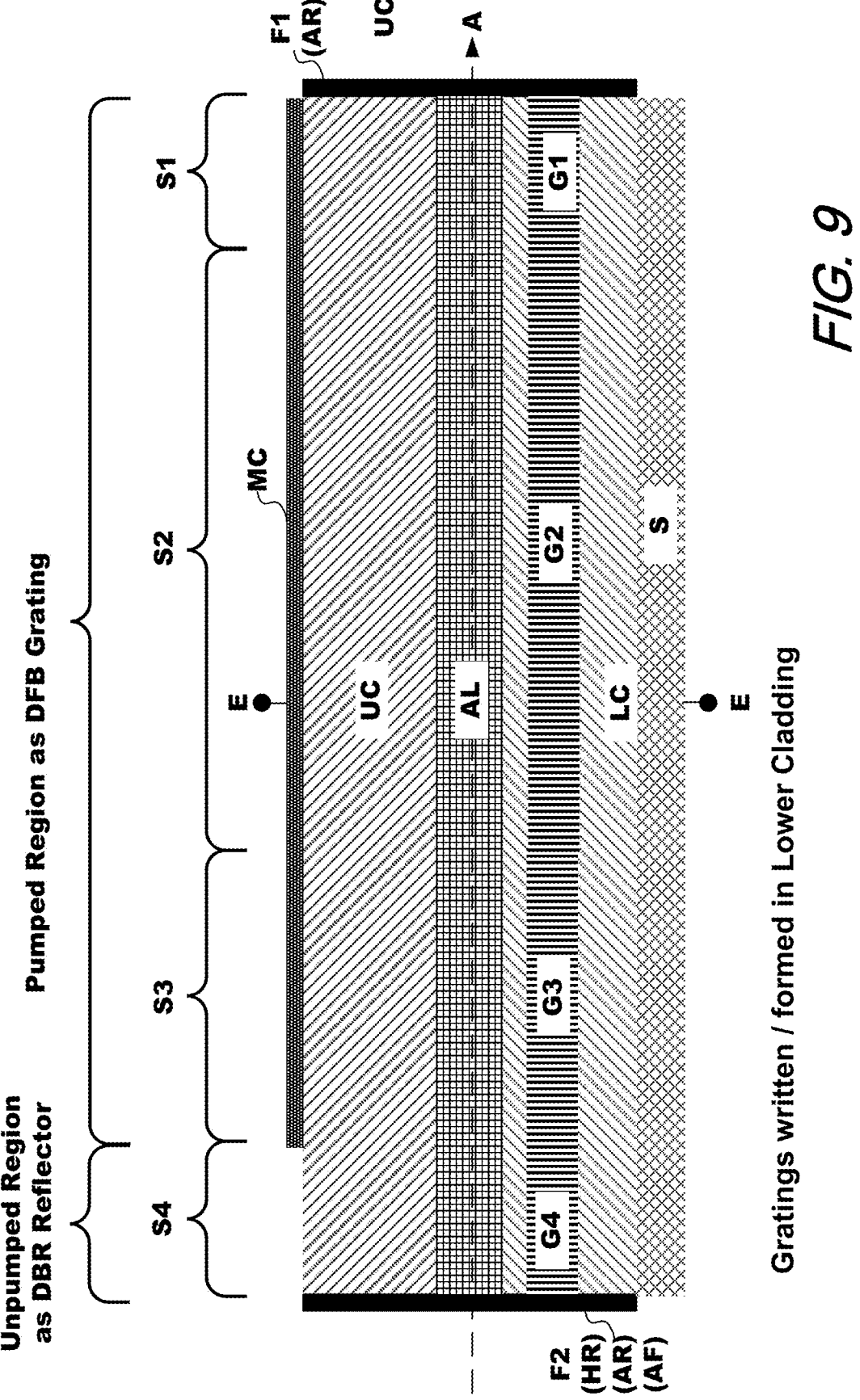
FIG. 9 is a schematic diagram illustrating a semiconductor DFB laser including a Distributed Bragg Reflector (DBR) reflector positioned in an unpumped region and a pumped region acting as a DFB grating wherein grating is formed below active layer according to aspects of the present disclosure.

FIG. 9 is a schematic diagram illustrating a semiconductor DFB laser including a Distributed Bragg Reflector (DBR) reflector positioned in an unpumped region and a pumped region acting as a DFB grating wherein grating is formed below active layer according to aspects of the present disclosure; and At this point, while we have presented this disclosure using some specific examples, those skilled in the art will recognize that our teachings are not so limited. In particular, the various combinations and locations of structural elements disclosed may be mixed/matched in any combination to meet application needs. Accordingly, this disclosure should only be limited by the scope of the claims attached hereto.

The invention claimed is:

1. A semiconductor laser with metal pull-back/opening pull-back distributed Bragg reflector (DBR) grating comprising:
   a continuous quantum-well (QW) active layer;
   an upper cladding layer positioned over the QW active layer;
   a lower cladding layer positioned under the QW active layer;
   a diffraction grating formed in one of the cladding layers, said diffraction grating exhibiting a different grating pitch in different particular sections of the semiconductor laser;
   wherein the diffraction grating extends along an entire length L of the semiconductor laser;
   wherein at least one section of the semiconductor laser is configured to be electrically pumped and at least another section of the semiconductor laser is configured to be electrically unpumped;
   wherein the QW active layer extends along the entire length of the semiconductor laser and exhibits a substantially identical composition and substantially uniform thickness in both electrically pumped and electrically unpumped sections.

2. The semiconductor laser of claim 1 including at least two (2) electrically pumped sections.

3. The semiconductor laser of claim 2 wherein a metal contact layer is positioned over the electrically pumped sections.

4. The semiconductor laser of claim 2 wherein at least one of the at least two electrically pumped sections is configured as a phase shift section having a diffraction grating exhibiting a pitch that is different from diffraction gratings in other electrically pumped sections.

5. The semiconductor laser of claim 4 wherein at least two of the electrically pumped sections have a diffraction grating exhibiting the same grating pitch.

6. The semiconductor laser of claim 1 wherein the active layer comprises InAlGaAs or InGaAsP material.

7. The semiconductor laser of claim 6 wherein a length of the unpumped section is less than a cumulative length of the pumped sections.

8. The semiconductor laser of claim 7 wherein an overall length L of the laser is less than 500 μm.

9. The semiconductor laser of claim 3 wherein the metal contact layer is positioned over the electrically unpumped section and electrically insulated from the electrically unpumped section by an electrical insulator.

10. A distributed feedback (DFB) laser comprising:
    a continuous waveguide active layer of substantially uniform thickness extending along a longitudinal axis;
    a Bragg grating structure arranged with respect to the waveguide and configured to provide distributed feedback along one or more sectional lengths of the waveguide and configured to provide distributed Bragg reflector (DBR) reflectivity along a different sectional length of the waveguide, the Bragg grating structure formed in a cladding layer adjacent to the continuous waveguide active layer;
    wherein a material composition of the continuous waveguide active layer is identical in both distributed feedback sectional lengths and distributed Bragg reflector sectional length.

11. The distributed feedback laser of claim 10 wherein the waveguide active layer is a quantum well (QW) active layer.

12. The distributed feedback laser of claim 11 further comprising an electrode arranged with respect to the waveguide and configured to electrically pump the one or more sectional lengths providing distributed feedback.

13. The distributed feedback laser of claim 12 wherein the electrode is arranged with respect to the waveguide and configured not to electrically pump the distributed Bragg reflector sectional length.

14. The distributed feedback laser of claim 13 wherein at least one sectional length of the Bragg grating structure configured to provide distributed feedback exhibits a grating pitch that is not the same as a grating pitch of the Bragg grating structure configured to provide distributed Bragg reflector reflectivity.

15. The semiconductor laser of claim 14 wherein the waveguide active layer comprises InAlGaAs or InGaAsP material.

16. A semiconductor laser comprising:
    a plurality of pumped, distributed feedback (DFB) grating regions;
    an unpumped, distributed Bragg reflector (DBR) grating region;
    an active layer that is associated with both the pumped DFB regions and the unpumped DBR region;
    a diffraction grating formed in a cladding layer adjacent to the active layer, diffraction grating providing the DFB and DBR grating regions;
    wherein the active layer extends along an entire length of the semiconductor laser and exhibits an identical material composition and substantially uniform thickness for the entire lengths of the pumped DFB regions and the unpumped DBR region.

17. The semiconductor laser of claim 16 wherein the pumped DFB regions include a metal electrode and the unpumped (DBR) region includes a metal pull-back.

18. The semiconductor laser of claim 17 wherein the active layer comprises InAlGaAs or InGaAsP material.

19. The laser of claim 18 wherein the unpumped DBR grating region exhibits a grating pitch that is different from a grating pitch of least one of the pumped DFB grating regions.

20. The distributed feedback laser of claim 16 wherein the active layer is a quantum well (QW) active layer.

* * * * *